(12) United States Patent
Nishio

(10) Patent No.: US 8,361,877 B2
(45) Date of Patent: Jan. 29, 2013

(54) MANUFACTURING METHOD OF SEMICONDUCTOR DEVICE, SEMICONDUCTOR DEVICE, AND METHOD OF PRINTING ON SEMICONDUCTOR WAFER

(75) Inventor: Yoshifumi Nishio, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 263 days.

(21) Appl. No.: 12/960,733

(22) Filed: Dec. 6, 2010

(65) Prior Publication Data

US 2011/0163422 A1   Jul. 7, 2011

(30) Foreign Application Priority Data

Jan. 6, 2010   (JP) ................. 2010-001229

(51) Int. Cl.
*H01L 21/301* (2006.01)
*H01L 21/46* (2006.01)
*H01L 21/78* (2006.01)
*H01L 23/544* (2006.01)

(52) U.S. Cl. ............... 438/401; 257/797; 257/E23.179

(58) Field of Classification Search .......... 438/401, 438/618; 257/621, 797, E25.018, E23.001, 257/E21.54, E23.176
See application file for complete search history.

(56) References Cited

U.S. PATENT DOCUMENTS 6,673,692 B2 * 1/2004 Peterson .............. 438/401
2006/0276000 A1 * 12/2006 Lim ..................... 438/401
2011/0194112 A1 * 8/2011 Zhou et al. ........... 356/401

FOREIGN PATENT DOCUMENTS

JP   2006-100724   4/2006

* cited by examiner

*Primary Examiner* — David S Blum
(74) *Attorney, Agent, or Firm* — Volentine & Whitt, PLLC

(57) ABSTRACT

A method of printing on a semiconductor wafer, a manufacturing method of a semiconductor device, and a semiconductor device which enable to easily perform positioning in the direction perpendicular to the top of the wafer and to easily identify the type of the wafer. The manufacturing method includes preparing a semiconductor wafer having a structure in which an element forming film is stacked on the top of an insulative transparent substrate, forming a light reflection film to reflect light for positioning on the bottom of the transparent substrate, irradiating a laser from the side at which the element forming film is disposed so as to form printed letters at the light reflection film, forming a semiconductor element at the element forming film, forming an interlayer dielectric film to cover the element forming film and the semiconductor element, forming a contact wire, and forming a metal wire on the interlayer dielectric film.

20 Claims, 4 Drawing Sheets

MANUFACTURING METHOD OF SEMICONDUCTOR DEVICE, SEMICONDUCTOR DEVICE, AND METHOD OF PRINTING ON SEMICONDUCTOR WAFER

BACKGROUND OF THE INVENTION

1. Field of the Invention

The present invention relates to a manufacturing method of a semiconductor device, a semiconductor device, and a method of printing on a semiconductor wafer, and, more particularly, to a manufacturing method of a semiconductor device, a semiconductor device, and a method of printing on a semiconductor wafer including technology to form printed letters for semiconductor wafer identification using a laser.

2. Description of the Related Art

In order to restrain a latch up phenomenon while easily achieving insulative separation between neighboring elements, semiconductor devices have traditionally been manufactured using a silicon on insulator (SOI) substrate. The SOI substrate has a structure in which a silicon substrate and a silicon thin film (SOI layer) are separated from each other by an embedded oxide film in an insulative state, i.e., a structure in which materials (silicon) of the same kind are joined to each other via an embedded oxide film, which is a dielectric film.

In recent years, a structure in which an insulative substrate formed of sapphire or quartz is used and different materials are joined to each other has been used in place of a structure having a silicon substrate and an embedded oxide film. In particular, a substrate formed of sapphire is referred to as a silicon on sapphire (SOS) substrate, and a substrate formed of quartz is referred to as a silicon on quartz (SOQ) substrate. Since the sapphire SOS substrate or the quartz substrate exhibits electrical insulation, various semiconductor elements formed at such a substrate may have little parasitic capacitance, excellent high frequency properties, and low power consumption.

Also, in a manufacturing process of a semiconductor device using the SOI substrate, the SOS substrate, or the SOQ substrate, printed letters for wafer identification are formed at a silicon thin film at which a semiconductor element is formed. Such printed letters enable process history, place of production, or properties of a wafer to be easily recognized even during the manufacturing process of the semiconductor device. For example, Japanese Patent Kokai No. 2006-100724 (Patent document 1) discloses a method of irradiating a laser to a silicon thin film of a SOS substrate to form printed letters (that is, to perform laser marking).

Also, since sapphire and quartz substrates transmit visible light, it may be difficult to perform positioning in the direction perpendicular to the surface of a wafer during manufacture of a semiconductor device. In order to solve such a problem, a light reflection film, made of a material, such as silicon nitride, which does not transmit visible light, is formed at the bottom of the sapphire substrate or the quartz substrate (the surface opposite to the surface at which a silicon thin film is formed), which is well-known technology.

SUMMARY OF THE INVENTION

In a case in which the SOS substrate or the SOQ substrate is used, however, it is difficult to recognize the printed letters from the bottom side of the SOS substrate or the SOQ substrate when laser marking is performed and then the light reflection film is formed. In addition, a metal wire is formed on the laser marked silicon thin film via an interlayer dielectric film, with the result that it is difficult to recognize the printed letters from the top side of the SOS substrate or the SOQ substrate after the metal wire is formed.

The present invention has been made in view of the above problems, and it is an object of the present invention to provide a manufacturing method of a semiconductor device, a semiconductor device, and a method of printing on a semiconductor wafer wherein it is possible to easily perform positioning in the direction perpendicular to the top of the semiconductor wafer, and, in addition, it is possible to easily identify the type of the semiconductor wafer.

In accordance with an aspect of the present invention, the above and other objects can be accomplished by the provision of a manufacturing method of a semiconductor device, including preparing a semiconductor wafer having a structure in which an element forming film is stacked on a top of an insulative transparent substrate, forming a light reflection film to reflect light for positioning in a direction perpendicular to the top of the semiconductor wafer on a bottom of the transparent substrate, irradiating a laser from a side at which the element forming film is disposed so as to form printed letters at the light reflection film, forming a semiconductor element at the element forming film, forming an interlayer dielectric film to cover the element forming film and the semiconductor element, forming a contact wire extending through the interlayer dielectric film such that the contact wire is electrically connected to the semiconductor element, and forming a metal wire on the interlayer dielectric film such that the metal wire is connected to the contact wire.

In accordance with another aspect of the present invention, there is provided a semiconductor device including a semiconductor wafer having a structure in which an element forming film is stacked on a top of an insulative transparent substrate and a light reflection film formed on a bottom of the transparent substrate so as to reflect light for positioning in a direction perpendicular to the top of the semiconductor wafer, wherein the light reflection film has a printing region at which printed letters for semiconductor wafer identification are provided.

In accordance with yet another aspect of the present invention, there is provided a method of printing on a semiconductor wafer having a structure in which a light reflection film, an insulative transparent substrate, and an element forming film are sequentially stacked, the printing method including irradiating a laser from a side at which the element forming film is disposed so as to form printed letters at the light reflection film.

According to the manufacturing method of the semiconductor device, the semiconductor, and the method of printing on the semiconductor wafer of the present invention, printed letters are formed at the light reflection film from the top side of the semiconductor wafer after the light reflection film is formed. Consequently, the printed letters are visible from the bottom side of the semiconductor wafer even in a case in which the metal wire is formed on the top of the wafer at which the light reflection film is formed. Also, the light reflection film reflects light for positioning in the direction perpendicular to the top of the semiconductor wafer, and therefore, it is possible to perform positioning in the direction perpendicular to the top of the semiconductor wafer. In addition, according to the manufacturing method of the semiconductor device, the semiconductor, and the method of printing on the semiconductor wafer of the present invention, it is possible to secure high reliability of the semiconductor element formed at the semiconductor wafer. Furthermore, it is possible to restrain increase in manufacturing costs of the semiconductor device.

DETAILED DESCRIPTION OF THE INVENTION

Hereinafter, embodiments of the present invention will be described in detail with reference to the accompanying drawings.

Embodiment

Figure 1A:
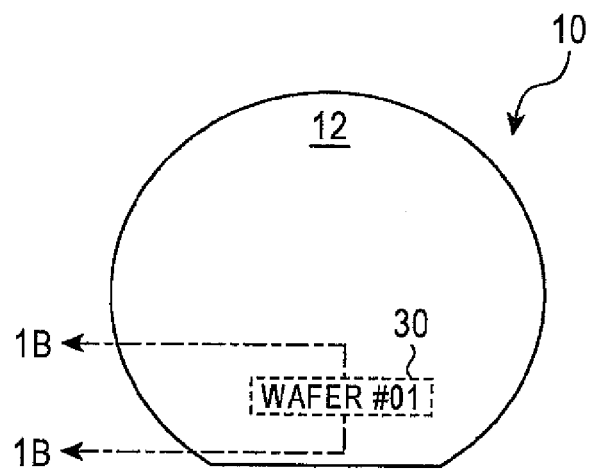
FIG. 1A is a bottom view of a semiconductor device according to an embodiment of the present invention.

First, the structure of a semiconductor device according to an embodiment of the present invention will be described with reference to FIGS. 1A and 1B. FIG. 1A is a bottom view of the semiconductor device, and FIG. 1B is a sectional view taken along line 1B-1B of FIG. 1A.

Figure 1B:
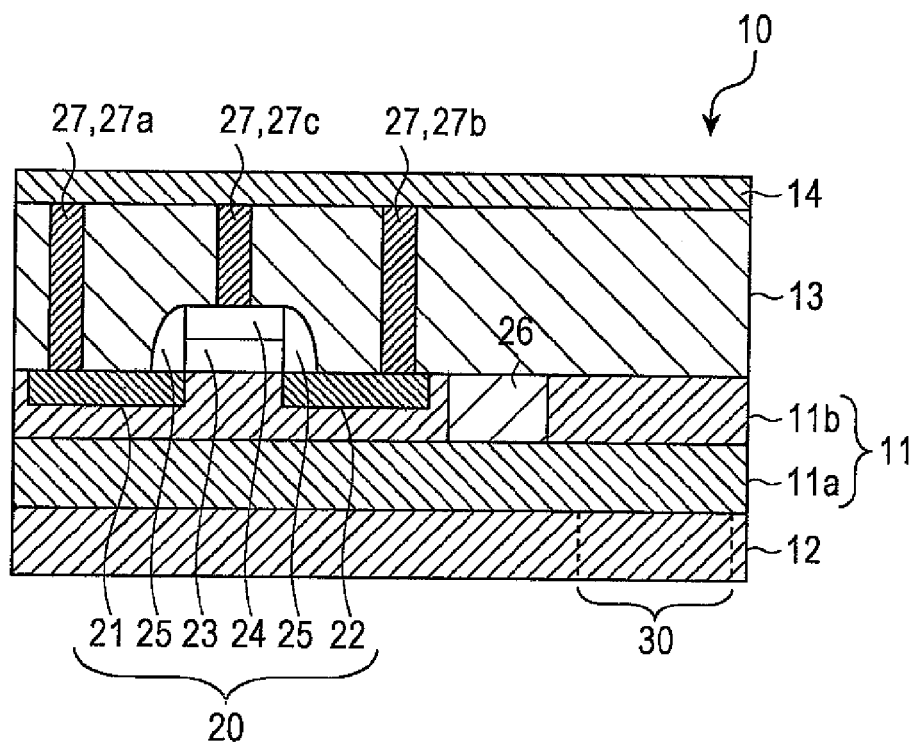
FIG. 1B is a sectional view taken along line 1B-1B of FIG. 1A.

As shown in FIGS. 1A and 1B, a wafer-shaped semiconductor device 10 includes a silicon on sapphire (SOS) substrate 11, a bottom stack film 12, an interlayer dielectric film 13, and a metal wire 14. Meanwhile, in the semiconductor device 10, the surface at which the metal wire is formed is referred to as the top, and the surface at which the light reflection film 12 is formed is referred to as the bottom.

The SOS substrate 11 has a two-layer structure including an insulative sapphire substrate 11a, through which visible light can be transmitted, and a silicon thin film (element forming film) 11b formed on the sapphire substrate 11a. A source region 21, a drain region 22, a gate oxide film 23, a gate electrode 24, and sidewalls 25, which constitute a semiconductor element 20, are formed at a predetermined region of the silicon thin film 11b. In addition, a field oxide film 26, which separates a plurality of semiconductor elements 20 from each other, is formed at a predetermined region of the silicon thin film 11b. Meanwhile, in the SOS substrate 11, the surface at which the semiconductor element 20 is formed is referred to as the top, and the surface at which the light reflection film 12 is formed is referred to as the bottom.

The interlayer dielectric film 13 is formed to cover the semiconductor element 20 and the silicon thin film 11b. Also, the interlayer dielectric film 13 is formed of a material that is capable of transmitting visible light. In addition, contact wires 27 are formed in the interlayer dielectric film 13 such that the contact wires 27 extend through the interlayer dielectric film 13. The source region 21, the drain region 22, and the gate electrode 24 are connected to the metal wire 14 via the respective contact wires 27. In the following description, a wire to connect the source region 21 and the metal wire 14 is referred to as a source contact wire 27a, a wire to connect the drain region 22 and the metal wire 14 is referred to as a drain contact wire 27b, and a wire to connect the gate electrode 24 and the metal wire 14 is referred to as a gate contact wire 27a.

The light reflection film 12 is formed of a material that does not transmit light for positioning in the thickness direction of the semiconductor device 10 (that is, the direction perpendicular to the top of the wafer) during manufacture of the semiconductor device 10. For example, when visible light is used for positioning, the light reflection film 12 may be formed of silicon nitride. Meanwhile, light, such as infrared light, having a different wavelength than the visible light may be used as the light for positioning. In this case, it is necessary to properly change the composition of the light reflection film 12. A printing region 30 is provided at a predetermined position of the light reflection film 12. As shown in FIG. 1A, printed letters for wafer identification consisting of an alphanumeric code and a symbol are formed at the printing region 30. In FIG. 1A, 'WAFER #01' is printed, and it is possible to recognize process history, place of production, and properties of the semiconductor wafer through the printed letters. The printed letters may be formed, for example, by laser marking using a laser. More specifically, a laser is irradiated to remove the light reflection film 12 from the printed letters indicating 'WAFER #01'. That is, the printed letters indicating 'WAFER #01' appear from through holes extending through the light reflection film 12. Also, a lot number may be printed. Meanwhile, the printed letters are not limited to 'WAFER #01'. Other numbers, symbols, and letters may be used.

Also, the through holes may extend through the SOS substrate 11 as well as the light reflection film 12. That is, during laser marking, a portion of the SOS substrate 11 and a portion of the light reflection film 12 may be simultaneously removed.

In the semiconductor device 10 of this embodiment, the printing region 30 is provided at the light reflection film 12 of the semiconductor device 10, the printed letters for wafer identification are formed at the printing region 30. Consequently, it is possible to recognize the printed letters from the bottom side of the semiconductor device 10 even in a state in which the metal wire 14, which does not transmit a visible light, is formed at the top side of the semiconductor device 10.

Also, in the semiconductor device 10 of this embodiment, the light reflection film 12 reflects light for positioning in the direction perpendicular to the top of the wafer. Consequently, it is possible to easily position the light reflection film in the direction perpendicular to the top of the semiconductor wafer during manufacture of the semiconductor device.

Hereinafter, a method of printing on the semiconductor wafer and a manufacturing method of the semiconductor device 10 will be described with reference to FIGS. 2A to 2D, 3A to 3D, and 4A to 4C. FIGS. 2A to 2D, 3A to 3D, and 4A to 4C are sectional views illustrating a manufacturing process of the semiconductor device 10.

Figure 2A:
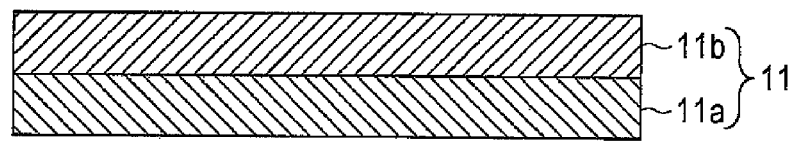
FIGS. 2A to 2D are sectional views illustrating a manufacturing process of the semiconductor device according to the embodiment of the present invention.

First, an SOS substrate (semiconductor wafer) 11 having a structure in which a silicon thin film 11b is stacked on a sapphire substrate 11a is prepared (FIG. 2A). More specifically, silicon is deposited on the sapphire substrate 11a using an epitaxial growth method. The deposited silicon has a large number of crystal defects due to lattice mismatch between the silicon and the sapphire. Subsequently, silicon ions are implanted into a deposited silicon film, and crystallinity of the silicon in the vicinity of the interface between the silicon film and the sapphire substrate 11a is destroyed, with the result that the silicon becomes amorphous. In addition, the silicon is solid-phase epitaxially grown in an oxidizing atmosphere through heat treatment, with the result that the amorphous silicon is recrystallized to form a silicon thin film 11b having a small number of defects. Afterwards, a thin film placed at the top of the silicon thin film 11b and having become silicon dioxide through heat treatment is removed from the silicon thin film 11b. As a result, an SOS substrate 11 is completed.

Figure 2B:
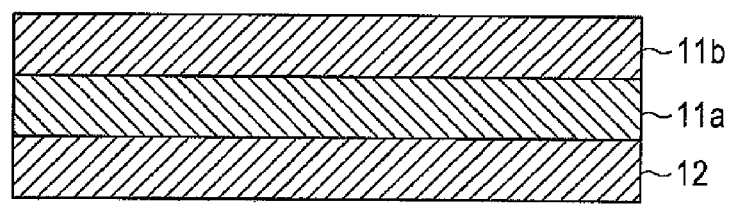

Next, a light reflection film 12 is formed on the bottom of the SOS substrate 11, i.e., on the surface opposite to the surface at which the silicon thin film 11b of the sapphire substrate 11a is formed (FIG. 2B). For example, silicon nitride is deposited over the entire surface of the SOS substrate 11 using a well-known film forming method, such as chemical vapor deposition (CVD) such that the Silicon nitride covers the entire surface of the SOS substrate 11. Subsequently, the silicon nitride placed only at the bottom side of the SOS substrate 11 is removed by etching. As a result, formation of a light reflection film 12 is completed. In this embodiment, the light reflection film 12 is formed of silicon nitride. However, the light reflection film 12 may be formed of a different material or may have a different stack structure as long as light for positioning in the direction perpendicular to the top of the wafer is blocked by the light reflection film 12.

Figure 2C:
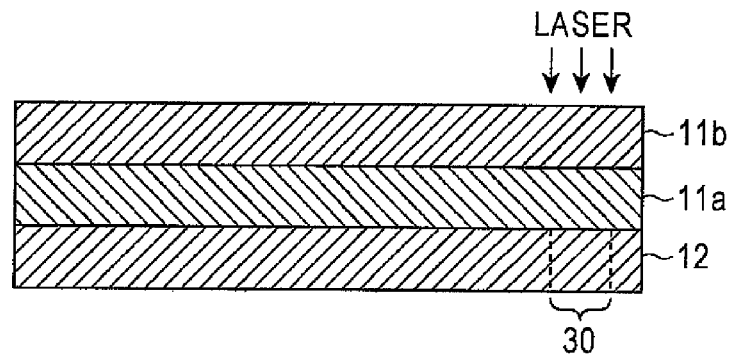

Next, a printing region 30 is formed at a predetermined position of the light reflection film 12 (FIG. 2C). More specifically, a laser having a predetermined wavelength is irradiated to the SOS substrate 11 from the top side of the SOS substrate 11 (that is, the side at which the silicon thin film 11b is formed), while holding the light reflection film 12, to remove a portion of the light reflection film 12. Visible printed letters ('WAFER #01' as shown in FIG. 1A) are formed by laser marking using a laser having such a wavelength. Meanwhile, immediately after the printed letters are formed, the printed letters for wafer identification indicating 'WAFER #01' can be seen from either the top or the bottom of the SOS substrate 11. Also, before this process is performed, the position of the SOS substrate 11 in the thickness direction of the SOS substrate 11 (that is, the direction perpendicular to the top of the SOS substrate 11) may be recognized by the above-described light for positioning so as to correctly perform laser irradiation.

Here, the predetermined wavelength of the laser exhibits a property wherein the laser is transmitted through the sapphire substrate 11a and the silicon thin film 11b to remove only the light reflection film 12. Reliability of produced semiconductor devices 10 is improved by such laser marking. Specifically, it is possible to restrain generation of particles during forming of through holes by removing only the light reflection film 12.

Meanwhile, a laser having a wavelength at which the sapphire substrate 11a, the silicon thin film 11b, and the light reflection film 12 can be removed instead of a laser having a wavelength at which the laser is transmitted through the sapphire substrate 11a and the silicon thin film 11b to remove only the light reflection film 12. In this case, an effect of restraining generation of particles is lower but a selection range of lasers is wider than in the above-described case.

Also, a laser is irradiated to the SOS substrate 11 from the top side of the SOS substrate 11, and therefore, it is not necessary to hold the top side of the SOS substrate 11 at which a semiconductor element 20 will be formed with a conveying arm. Consequently, it is possible to restrain damage to the top of the SOS substrate 11, which is an element forming surface, and addition of foreign matter to the top of the SOS substrate 11. That is, it is possible to improve reliability of a semiconductor device 10 and to increase yield as compared with a case in which a laser is irradiated to the SOS substrate 11 from the bottom side of the SOS substrate 11 to perform laser marking.

In the past, a laser is irradiated to the SOS substrate 11 from the top side of the SOS substrate 11 so as to form printed letters on the top of the SOS substrate 11. Consequently, it is possible to use existing equipment through adoption of the above-described printing method. That is, an apparatus to reverse a wafer and a corresponding manufacturing process are not necessary, and therefore, it is possible to reduce manufacturing costs, the number of manufacturing processes, and manufacturing time, as compared with a case in which a laser is irradiated to the SOS substrate 11 from the bottom side of the SOS substrate 11 to perform laser marking.

Figure 2D:
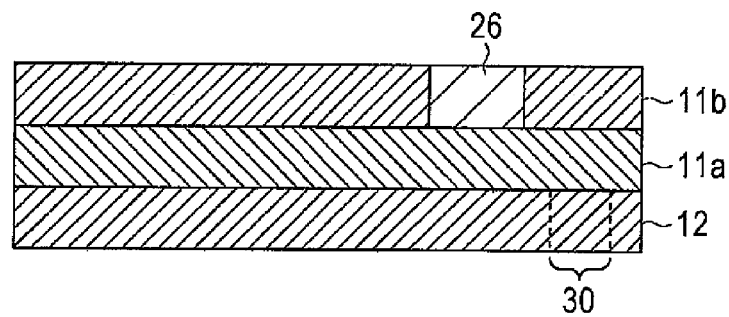

Next, a field oxide film 26 is formed in the silicon thin film 11b (FIG. 2D). Consequently, it is possible to electrically separate a plurality of semiconductor elements 20 from each other when the semiconductor elements 20 are formed at the silicon thin film 11b. The field oxide film 26 may be formed using a well-known method, such as local oxidation of silicon (LOCOS) or shallow trench isolation (STI).

For example, when the LOCOS separation method is used, first, the silicon thin film 11b is thermally oxidized to grow a silicon dioxide film on the top of the silicon thin film 11b. Subsequently, ammonia and silane gases are reacted with each other to deposit silicon nitride on the grown silicon dioxide film. In addition, a portion of the deposited silicon nitride is removed by etching to expose a specific region, which will be a field oxide film 26 later. In addition, silicon dioxide is grown on the region exposed through thermal oxidation, and then the unnecessary silicon nitride is removed. As a result, formation of a field oxide film 20 is completed.

When the STI separation method is used, first, the silicon thin film 11b is thermally oxidized to grow a silicon dioxide film on the top of the silicon thin film 11b. Subsequently, ammonia and silane gases are reacted with each other to deposit silicon nitride on the grown silicon dioxide film. In addition, a portion of the silicon dioxide film and a portion of the silicon nitride are removed by etching to form a shallow trench in the silicon thin film 11b. In addition, silicon dioxide is grown on the region exposed through thermal oxidation and deposition using silane and oxygen gases to implant silicon dioxide into the shallow trench. Afterwards, the unnecessary silicon dioxide and the unnecessary silicon nitride are removed from the top of the silicon thin film 11b. As a result, formation of a field oxide film 20 is completed.

Figure 3A:
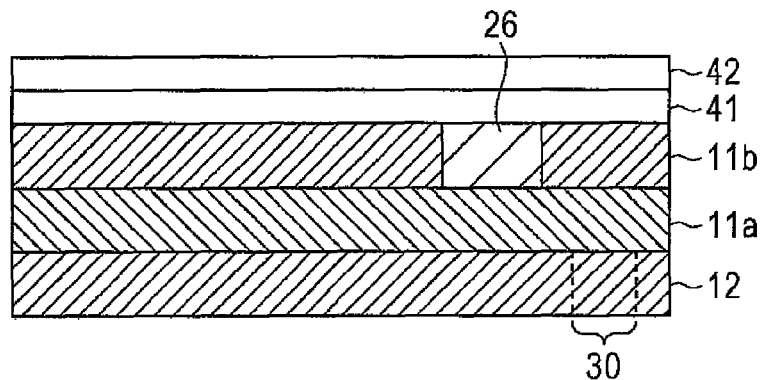
FIGS. 3A to 3D are sectional views illustrating a manufacturing process of the semiconductor device according to the embodiment of the present invention.

Next, a thin silicon oxide film 41 is grown on the top of the silicon thin film 11b through thermal oxidation. Subsequently, silane gas is thermally decomposed in nitride gas using CVD to grow a polycrystalline silicon (PolySi) film 42 (FIG. 3A).

Figure 3B:
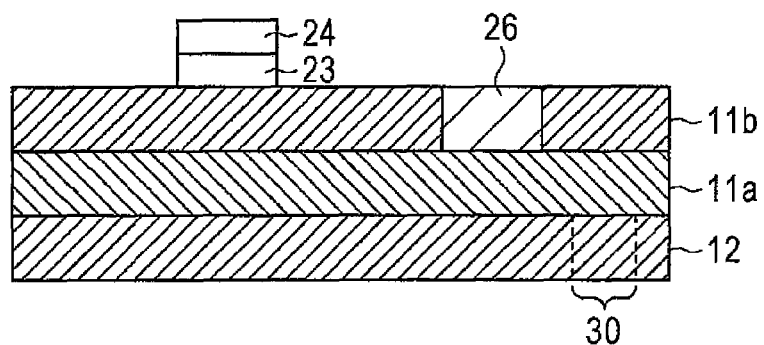

Next, a resist is applied so as to cover the polycrystalline silicon film 42. Subsequently, the resist is patterned using photolithography. In addition, etching is performed using the patterned resist as a mask to form the silicon oxide film 41 and the polycrystalline silicon film 42 into predetermined shapes. As a result, a plurality of gate oxide films 23 and a plurality of gate electrodes 24 are formed (FIG. 3B). Upon completion of formation of the gate oxide films 23 and the gate electrodes 24, the resist is removed.

Figure 3C:
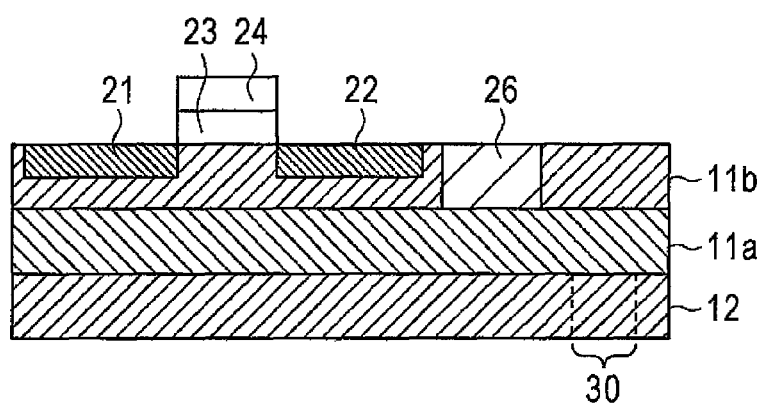

Next, a resist is applied so as to cover the silicon thin film 11b, the gate oxide film 23, and the gate electrode 24. Subsequently, the resist is patterned using photolithography. In addition, dopant ions, such as phosphorus ions, are implanted using the patterned resist as a mask to form a source region 21 and a drain region 22 (FIG. 3C). Upon completion of forming the source region 21 and the drain region 22, the resist is removed.

Figure 3D:
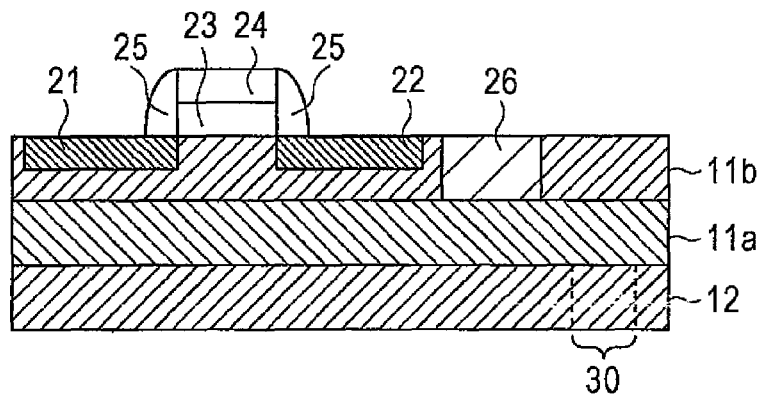

Next, sidewalls 25 are formed so as to cover sides of the gate oxide film 23 and the gate electrode 24 (FIG. 3D). More specifically, first, silicon oxide is deposited using a film forming method, such as plasma CVD, so as to cover the silicon thin film 11b, the gate oxide film 23, and the gate electrode 24.

Subsequently, so that the silicon oxide remains only at side parts of the gate oxide film 23 and the gate electrode 24, the silicon oxide is removed from the remaining parts of the gate oxide film 23 and the gate electrode 24 using high anisotropy dry etching. As a result, sidewalls 25 are completed.

Figure 4A:
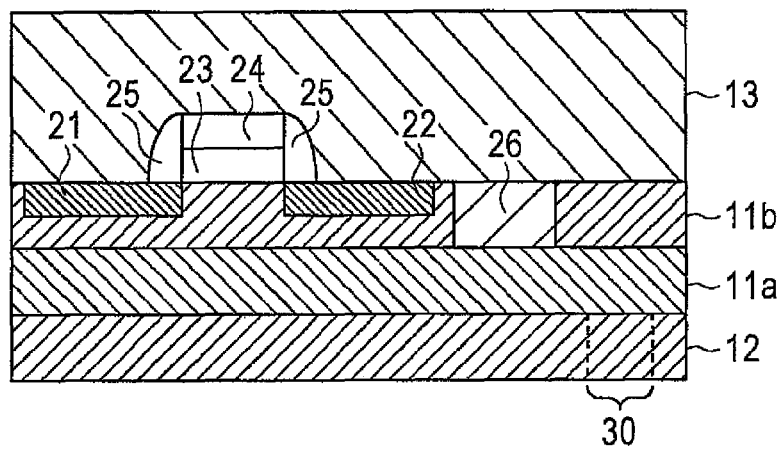
FIGS. 4A to 4C are sectional views illustrating a manufacturing process of the semiconductor device according to the embodiment of the present invention.

Next, an interlayer dielectric layer 13 is formed so as to cover the silicon thin film 11b and the semiconductor element 20 formed at the silicon thin film 11b (FIG. 4A). More specifically, silicon oxide is deposited through CVD using silane and oxygen gases. Afterwards, the top of the deposited silicon oxide is smoothed through chemical mechanical polishing (CMP). As a result, formation of an interlayer dielectric layer 13 is completed.

Figure 4B:
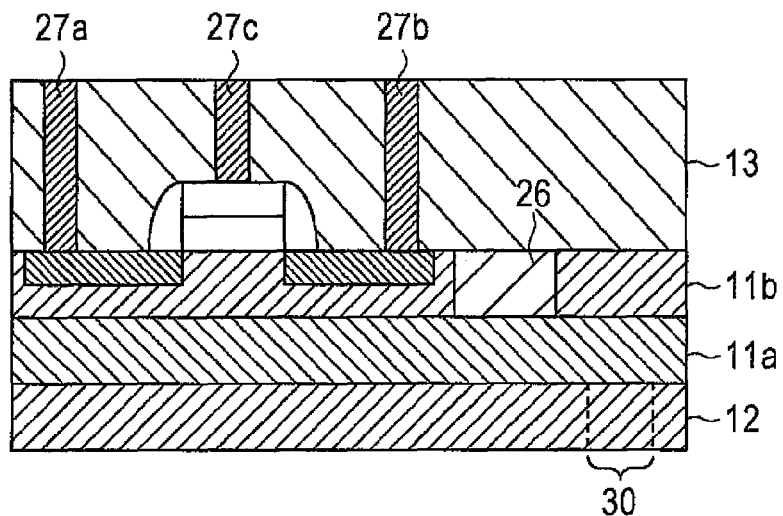

Next, a source contact wire 27a, a drain contact wire 27b, and a gate contact wire 27c are formed such that the source contact wire 27a, the drain contact wire 27b, and the gate contact wire 27c extend through the interlayer dielectric layer 13 reaching the source region 21, the drain region 22, and the gate electrode 24 (FIG. 4B). More specifically, first, a resist is applied so as to cover the interlayer dielectric layer 13. Subsequently, the resist is patterned using photolithography. In addition, etching is performed using the patterned resist as a mask to form contact holes extending to the source region 21, the drain region 22, and the gate electrode 24. Subsequently, tungsten is deposited in the respective contact holes using CVD. As a result, formation of a source contact wire 27a, a drain contact wire 27b, and a gate contact wire 27c is completed.

Figure 4C:
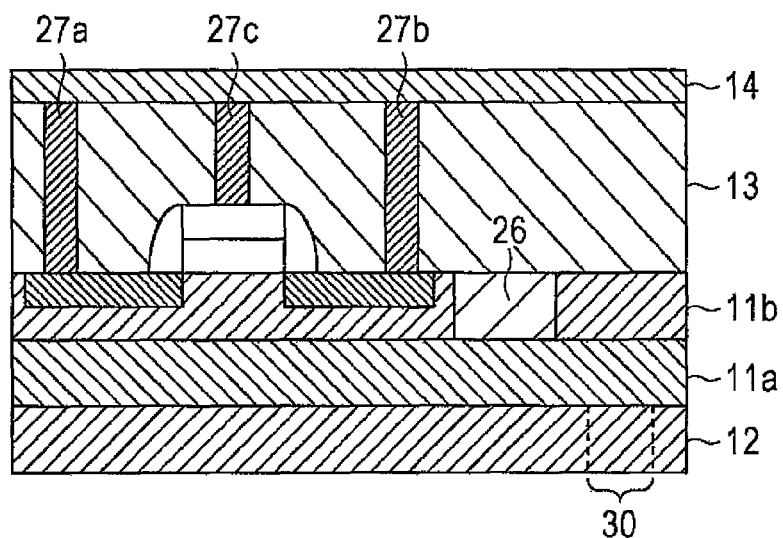

Next, a metal wire 14 is formed on the interlayer dielectric layer 13 (FIG. 4C). More specifically, first, aluminum is deposited on the interlayer dielectric layer 13 using sputtering. Subsequently, a resist is applied to the deposited aluminum, and the resist is patterned. Afterwards, etching is performed using the patterned resist as a mask. As a result, formation of a metal wire 14 having a predetermined shape is completed.

Through the above-described processes, a wafer-shaped semiconductor device is completed. Meanwhile, the respective manufacturing processes of the semiconductor device may be performed after positioning is performed in the direction perpendicular to the top of the wafer using the light reflection film 12.

According to the manufacturing method of the semiconductor device, the semiconductor, and the method of printing on the semiconductor wafer of the present invention as described above, printed letters are formed at the light reflection film from the top side of the semiconductor wafer after the light reflection film is formed. Consequently, the printed letters are visible from the bottom side of the semiconductor wafer even in a case in which the metal wire is formed on the top of the wafer at which the light reflection film is formed. In addition, it is possible to perform positioning in the direction perpendicular to the top of the semiconductor wafer.

Also, according to the manufacturing method of the semiconductor device, the semiconductor, and the method of printing on the semiconductor wafer of the present invention, it is possible to secure high reliability of the semiconductor element formed at the semiconductor wafer. In addition, it is possible to restrain increase in manufacturing costs of the semiconductor device.

Meanwhile, in order to solve the problems as described above, a laser may be directly irradiated to the light reflection film 12 from the bottom side of the light reflection film 12. However, it is not possible to use this method for the following reasons. In a case in which a laser is directly irradiated to the light reflection film 12 from the bottom side of the light reflection film 12, it is necessary to hold the semiconductor wafer 11 using a conveying arm. In addition, the semiconductor element forming surface may be damaged, and foreign matter may attached to the semiconductor element forming surface. In particular, it is possible to remove the foreign matter attached to the semiconductor element forming surface through washing, but it is not possible to recover the damage to the semiconductor element forming surface, which results in a fatal defect of the semiconductor device.

In addition, in order to solve the problems as described above, the semiconductor wafer 11 may be reversed using an instrument to hold the outer circumference (side) of the semiconductor wafer 11, and a laser may be directly irradiated to the light reflection film 12 from the bottom side of the light reflection film 12. In this method, however, it is necessary to greatly modify existing equipment. Also, it is not possible to adopt this method in consideration of a cost performance ratio.

As can be seen from the above description, the manufacturing method of the semiconductor device and the method of printing on the semiconductor wafer according to the present invention are considered with respect to the problems of the examination results as described above and do not cause the above-described problems.

Also, an SOS wafer is used as the semiconductor wafer in the above-described embodiment. However, a different semiconductor wafer, such as a silicon on quartz (SOQ) wafer or a silicon on insulator (SOI) wafer, may be used. In such a different semiconductor wafer, a transparent substrate that is capable of transmitting light (infrared light or ultraviolet light) different from visible light may be used as an insulative substrate. That is, the transparent substrate may be a substrate that transmits only visible light, a substrate that transmits only light having a different wavelength band, or a substrate that transmits visible light and light having a different wavelength band. In this case, it is possible to use light (infrared light or ultraviolet light) different from visible light as light for positioning in the direction perpendicular to the top of the semiconductor wafer. In addition, the material for the portion forming the semiconductor element is not limited to silicon. Other semiconductor materials may be used.

This application is based on Japanese Patent Application No. 2010-001229 which is herein incorporated by reference.

What is claimed is:

1. A manufacturing method of a semiconductor device, comprising:
    preparing a semiconductor wafer having a structure in which an element forming film is stacked on a top of an insulative transparent substrate;
    forming a light reflection film to reflect light for positioning in a direction perpendicular to a top of the semiconductor wafer on a bottom of the transparent substrate;
    irradiating a laser from a side at which the element forming film is disposed so as to form printed letters at the light reflection film;
    forming a semiconductor element at the element forming film;
    forming an interlayer dielectric film to cover the element forming film and the semiconductor element;
    forming a contact wire extending through the interlayer dielectric film such that the contact wire is electrically connected to the semiconductor element; and
    forming a metal wire on the interlayer dielectric film such that the metal wire is connected to the contact wire.

2. The manufacturing method according to claim 1, wherein the step of forming the printed letters comprises irradiating the laser while holding the light reflection film.

3. The manufacturing method according to claim 1, wherein the laser is transmitted through the element forming film and the transparent substrate so as to remove only the light reflection film.

4. The manufacturing method according to claim 2, wherein the laser is transmitted through the element forming film and the transparent substrate so as to remove only the light reflection film.

5. The manufacturing method according to claim 1, wherein the transparent substrate is formed of sapphire or quartz.

6. The manufacturing method according to claim 2, wherein the transparent substrate is formed of sapphire or quartz.

7. The manufacturing method according to claim 3, wherein the transparent substrate is formed of sapphire or quartz.

8. A semiconductor device comprising:
    a semiconductor wafer having a structure in which an element forming film is stacked on a top of an insulative transparent substrate; and
    a light reflection film formed on a bottom of the transparent substrate so as to reflect light for positioning in a direction perpendicular to a top of the semiconductor wafer, wherein
    the light reflection film has a printing region at which printed letters for semiconductor wafer identification are provided.

9. The semiconductor device according to claim 8, wherein the printed letters comprise through holes extending through only the transparent substrate.

10. The semiconductor device according to claim 9, wherein the printed letters provided at the printing region indicate process history, place of production, and properties of the semiconductor wafer.

11. The semiconductor device according to claim 9, further comprising at least one semiconductor element formed at the element forming film.

12. The semiconductor device according to claim 10, further comprising at least one semiconductor element formed at the element forming film.

13. A method of printing on a semiconductor wafer having a structure in which a light reflection film, an insulative transparent substrate, and a element forming film are sequentially stacked, the printing method comprising
    irradiating a laser from a side at which the element forming film is disposed so as to form printed letters at the light reflection film.

14. The printing method according to claim 13, wherein the step of forming the printed letters is performed while holding the light reflection film.

15. The printing method according to claim 13, wherein the laser is transmitted through the element forming film and the transparent substrate so as to remove only the light reflection film.

16. The printing method according to claim 14, wherein the laser is transmitted through the element forming film and the transparent substrate so as to remove only the light reflection film.

17. The printing method according to claim 13, wherein the transparent substrate is formed of sapphire or quartz.

18. The printing method according to claim 14, wherein the transparent substrate is formed of sapphire or quartz.

19. The printing method according to claim 15, wherein the transparent substrate is formed of sapphire or quartz.

20. The printing method according to claim 16, wherein the transparent substrate is formed of sapphire or quartz.

* * * * *